(12) United States Patent
Iori et al.

(10) Patent No.: US 8,231,767 B2
(45) Date of Patent: Jul. 31, 2012

(54) MAGNETIC FIELD GENERATING APPARATUS AND PLASMA PROCESSING APPARATUS

(75) Inventors: Kazuyuki Iori, Kawasaki (JP); Masayoshi Ikeda, Hachioji (JP); Yasumi Sago, Tachikawa (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 12/974,811

(22) Filed: Dec. 21, 2010

(65) Prior Publication Data

US 2011/0121927 A1 May 26, 2011

Related U.S. Application Data

(63) Continuation of application No. PCT/JP2009/002868, filed on Jun. 23, 2009.

(30) Foreign Application Priority Data

Jun. 24, 2008 (JP) .................. 2008-164654

(51) Int. Cl.
  C25B 9/00 (2006.01)
  C25B 11/00 (2006.01)
  C25B 13/00 (2006.01)
  C23C 14/00 (2006.01)
(52) U.S. Cl. ............ 204/298.16; 204/298.17; 204/298.2
(58) Field of Classification Search ............. 204/298.16, 204/298.17, 298.2
  See application file for complete search history.

(56) References Cited

U.S. PATENT DOCUMENTS

| 4,995,958 | A * | 2/1991 | Anderson et al. .......... 204/298.2 |
| 2003/0024478 | A1 | 2/2003 | Egami et al. |
| 2008/0113149 | A1 | 5/2008 | Egami et al. |
| 2009/0283976 | A1 | 11/2009 | Kaneko et al. ................ 279/128 |
| 2010/0276275 | A1 | 11/2010 | Sasaki et al. ............. 204/192.15 |
| 2010/0294656 | A1 | 11/2010 | Ikeda et al. |

FOREIGN PATENT DOCUMENTS

| JP | 11-001772 | 1/1999 |
| JP | 2001-262337 | 9/2001 |
| JP | 2002-363740 | 12/2002 |
| JP | 2003-49274 | 2/2003 |
| JP | 2004-162138 | 6/2004 |
| JP | 2005-54251 | 3/2005 |

* cited by examiner

Primary Examiner — Luan Van
Assistant Examiner — Ibrahime A Abraham
(74) Attorney, Agent, or Firm — Fitzpatrick, Cella, Harper & Scinto

(57) ABSTRACT

A magnetic field generating apparatus which generates a cusped magnetic field on an electrode includes a magnet mechanism which is attached to the electrode and includes a plurality of magnets held on a holding plate, and a rotation mechanism which rotates the holding plate. The plurality of magnets (61) are regularly arrayed to be point-symmetrical about a specific point. The specific point is at a position shifted from the center of rotation of the holding plate by the rotation mechanism.

6 Claims, 9 Drawing Sheets

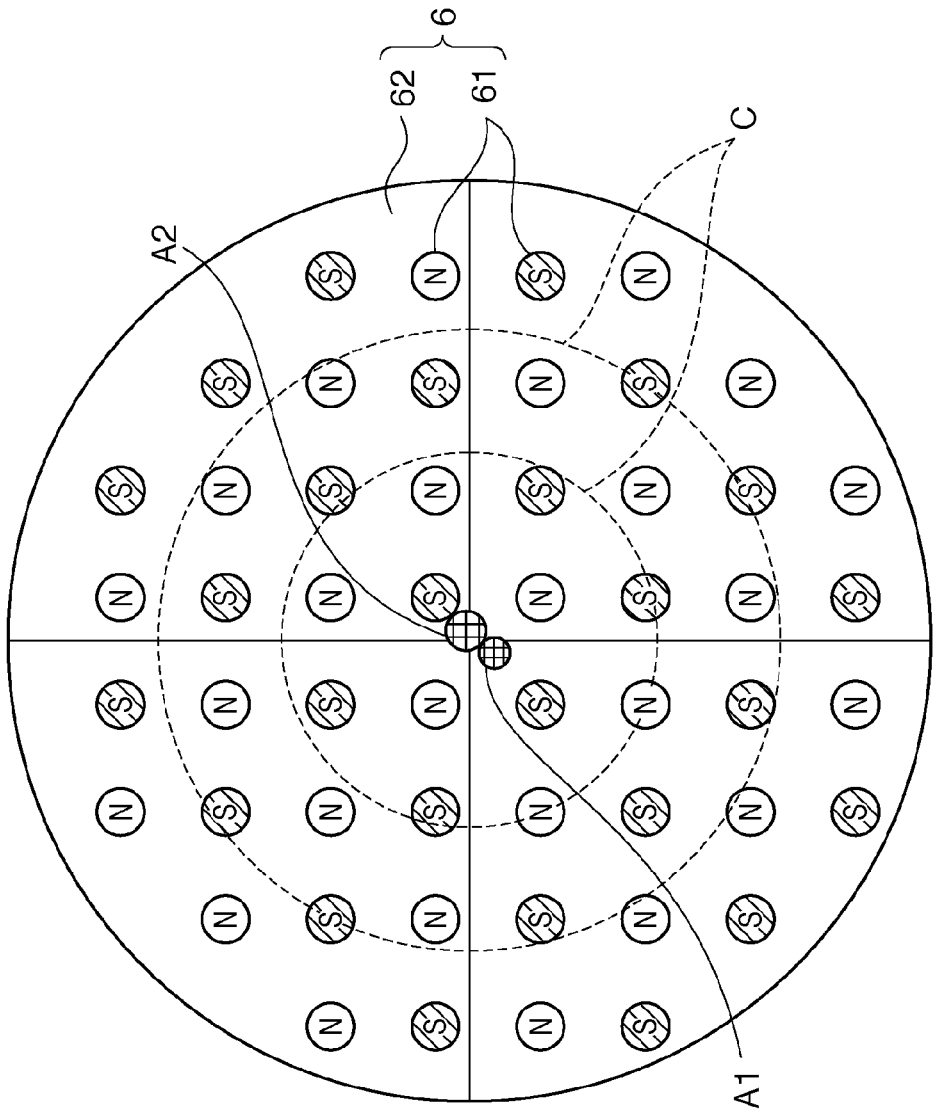

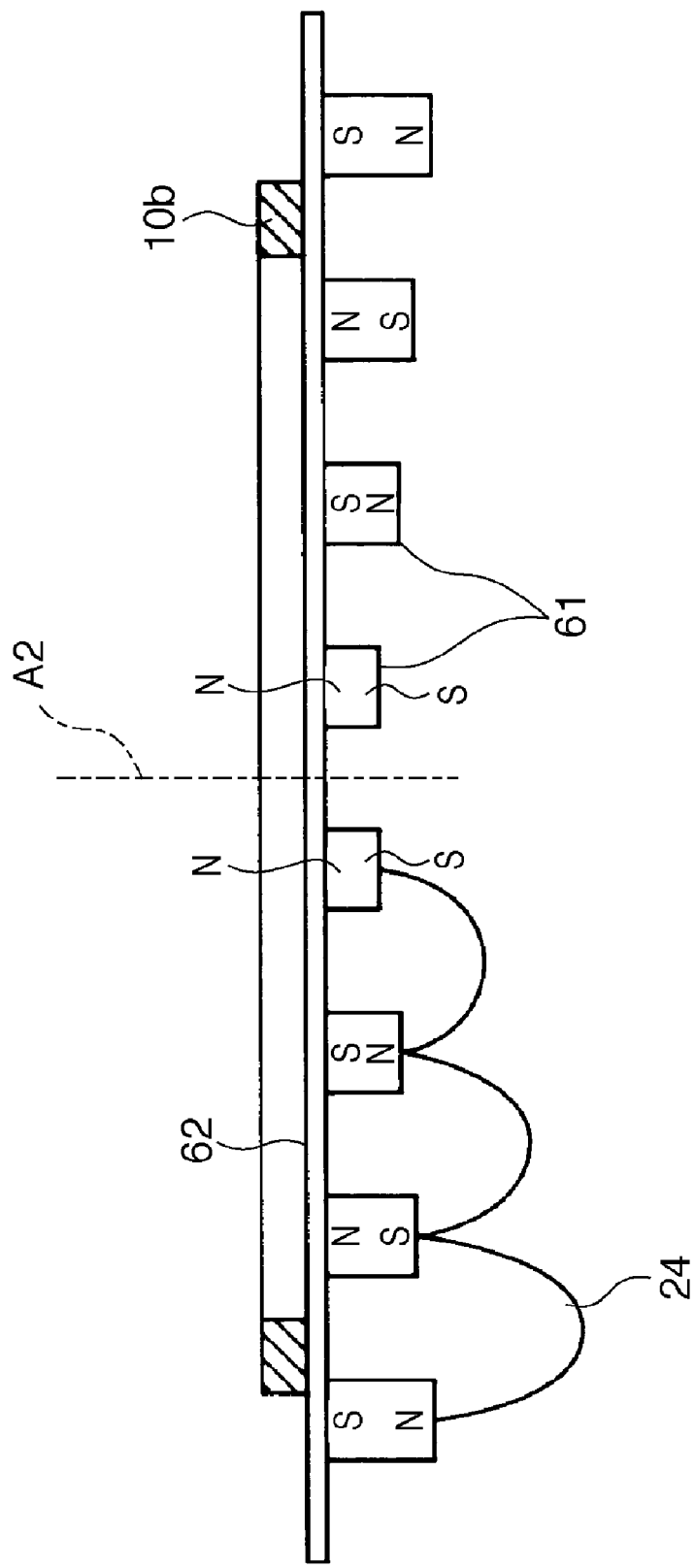

MAGNETIC FIELD GENERATING APPARATUS AND PLASMA PROCESSING APPARATUS

CROSS-REFERENCE TO RELATED APPLICATION

This application is a continuation of International Application No. PCT/JP2009/002868, filed Jun. 23, 2009, which claims the benefit of Japanese Patent Application No. 2008-164654, filed Jun. 24, 2008. The contents of the aforementioned applications are incorporated herein by reference in their entirety.

TECHNICAL FIELD

The present invention relates to a plasma processing apparatus for use in, for example, deposition and microfabrication on a substrate and a magnetic field generating apparatus suitable for the plasma processing apparatus. The present invention more specifically relates to a magnetic field generating apparatus which forms a point-cusped magnetic field in the vicinity of a target for a plasma processing apparatus by a plurality of magnets, and a plasma processing apparatus including the magnetic field generating apparatus.

BACKGROUND ART

Patent documents 1 and 2 give examples of a plasma processing apparatus to which a conventional point-cusped magnetic field (PCM) is applied. The apparatuses disclosed in these patent literatures can generate plasma at a high density in the vicinity of a target attached to an electrode by forming a point-cusped magnetic field on the target. To generate a point-cusped magnetic field, a plurality of point-like magnets are arrayed on the back surface of the target such that all adjacent magnets have an equal distance between them and have magnetic pole end faces with opposite polarities.

In particular the plasma processing apparatus shown in patent document 1 rotates a magnet mechanism, which includes a plurality of magnets that form a point-cusped magnetic field, to rotate the point-cusped magnetic field on a sputtering target, thereby uniforming a circumferentially formed magnetic field.

PRIOR ART DOCUMENTS

Patent Documents

Patent Document 1: Japanese Patent Laid-Open No. 2002-363740
Patent Document 2: Japanese Patent Laid-Open No. 2003-49274

SUMMARY OF INVENTION

Technical Problem

However, in the magnet mechanism which forms a point-cusped magnetic field shown in patent document 1, a plurality of magnets are arranged in concentric circles having the center of rotation of the magnet mechanism as their center. No horizontal magnetic field (X and Y components) is generated, that is, only a vertical magnetic field (Z component) is generated on the target surface at a position immediately above each magnet.

Therefore, upon rotating the magnet mechanism, the vertical magnetic field on the target surface concentrates on the circumference of a single circle on the target surface, so the plasma density becomes lower in the circumference of this circle than in other regions, and this slows down the sputtering rate on the circumference of this circle. On the other hand, in the strongly sputtered erosion region, some of the sputtered atoms are reflected back due to scattering by gas molecules, and are deposited again on the target member.

At this time, re-deposition of the sputtered atoms predominates in the region on the magnet, in which the sputtering rate is relatively low, and the film which has been deposited on the target member again has a low density and is loosely adhered to it. Therefore, such a film easily separates from the target member and generates particles which adhere to the surface of a processing substrate.

The strongly sputtered erosion region also concentrates on the circumference of a single circle, and this deteriorates the target use efficiency.

It is an objective of the present invention to provide a magnetic field generating apparatus that can be used for a plasma processing apparatus which prevents particle generation on a processing object to improve the target use efficiency.

Solution to Problem

In order to achieve the above-mentioned objective, according to the present invention, there is provided a magnetic field generating apparatus which generates a cusped magnetic field on an electrode,
the apparatus comprising:
a magnet mechanism which is attached to the electrode and includes a plurality of magnets held on a holding plate; and
a rotation mechanism which rotates the holding plate,
wherein the plurality of magnets are arranged at grid points of a regular polygonal grid, and arrayed to be point-symmetrical about the center of a unit grid of the regular polygonal grid, and
the center of rotation of the holding plate by said rotation mechanism falls within the unit grid, and is at a position shifted from the center of the unit grid.

Advantageous Effects of Invention

The present invention can provide a magnetic field generating apparatus that can be used for a plasma processing apparatus which prevents particle generation on a processing object to improve the target use efficiency.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 2 is a plan view showing the arrangement of magnets in a magnet mechanism in the embodiment;

FIG. 4 is a side sectional view showing a modification in which the strengths of magnets change in the radial direction of a disk-shaped holding plate;

DESCRIPTION OF EMBODIMENTS

Embodiments of the present invention will be described below. The constituent elements described in these embodiments are merely examples, so the technical scope of the present invention is determined by the scope of claims and is not limited by the following individual embodiments.

Figure 1:
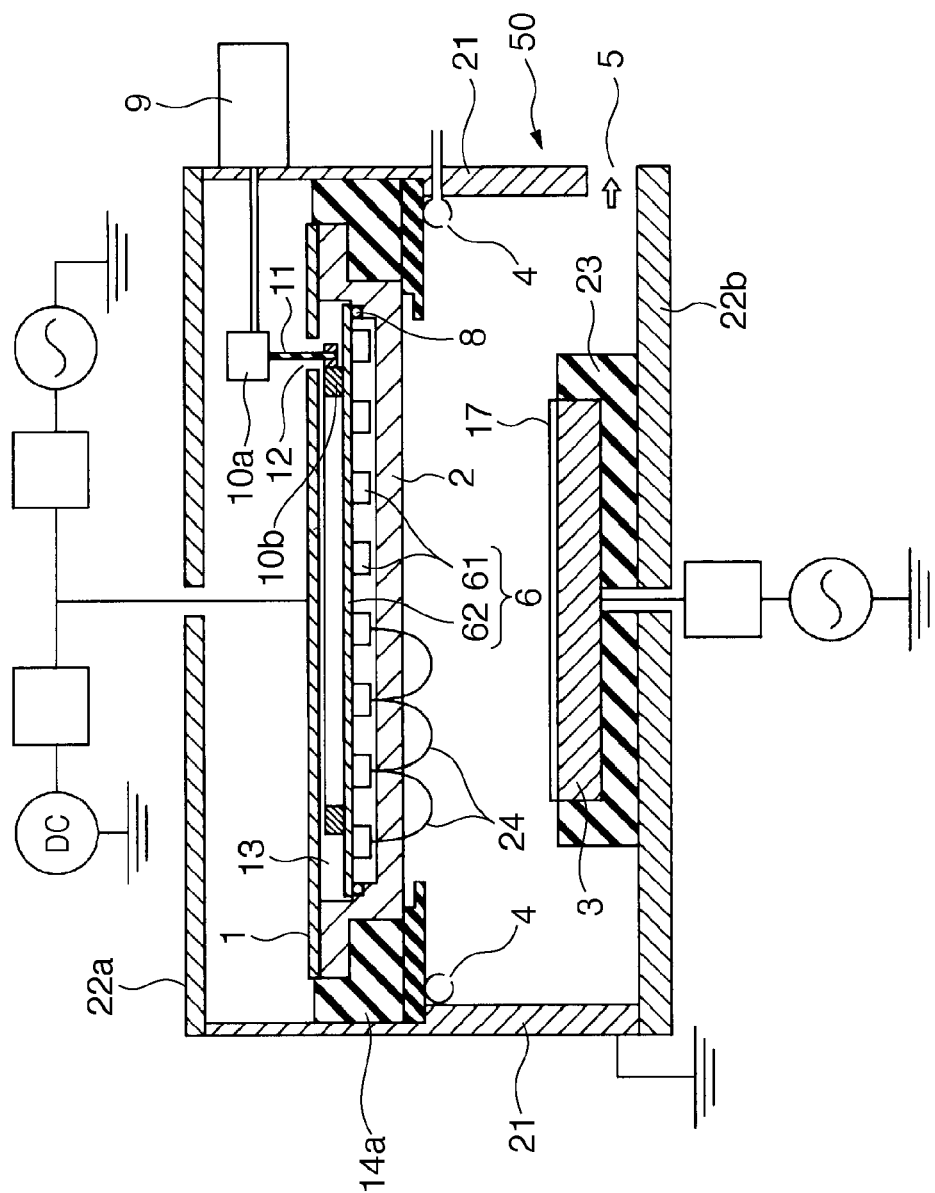
FIG. 1 is a schematic sectional view showing the arrangement of a plasma processing apparatus according to an embodiment of the present invention.

FIG. 1 is a schematic sectional view showing a capacitively-coupled sputtering apparatus according to the embodiment as an example of a plasma processing apparatus.

In the sputtering apparatus shown in FIG. 1, a reaction vessel 50 includes an upper electrode 1, target member (sputtering target) 2, lower electrode 3, cylindrical side wall 21, ceiling plate (top plate) 22a, bottom plate 22b, and wafer holder 23.

The target member 2 is provided on the surface of the upper electrode 1, which faces the wafer holder 23, as a plate-like member. A magnet mechanism 6 including a plurality of magnets 61 held on a holding plate 62 is provided between the upper electrode 1 and the target member 2 to form a magnetic field generating apparatus according to the present invention. The reaction vessel 50 also includes a gas introduction portion 4 and vacuum exhaust portion 5. The vacuum exhaust portion 5 is connected to a vacuum pump (not shown).

The upper electrode 1 is made of a conductor such as Al (aluminum) and disposed on a ring 14a made of a dielectric substance such as ceramics. The upper electrode 1 has a circular shape. The size of the upper electrode 1 depends on that of a wafer (substrate) 17 to be processed. The cylindrical side wall 21, ceiling plate 22a, and bottom plate 22b are made of a metal and electrically grounded.

The target member 2 contains a metal such as copper and is sputtered to be deposited on the surface of the wafer 17 held by the wafer holder 23. The wafer 17 is mounted on the lower electrode 3 provided on the wafer holder 23. The target member 2 is fixed onto the upper electrode 1 by, for example, bolting or diffusion bonding. Although the target member 2 is held by the upper electrode 1 in this embodiment, it may be held by a holding member that is different from the upper electrode 1 and is disposed between the upper electrode 1 and the lower electrode 3. The shapes of the upper electrode 1 and target member 2 are designed such that they have a cavity 13 between them. The diameters of the upper electrode 1 and target member 2 are selected depending on that of the wafer 17.

Although the size of the wafer 17 is not particularly limited, this sputtering apparatus can be used to process, for example, a 200- to 300-mm wafer or flat panel.

The magnet mechanism 6 includes the large number of cylindrical magnets 61 with the same magnetic force, and the holding plate 62 on which the magnets 61 are arranged. In this embodiment, the holding plate 62 has a disk shape and is preferably formed from a metal which serves as a yoke although its material is not particularly limited.

Each magnet 61 has its one magnetic pole attached to the holding plate 62, and its other magnetic pole facing the wafer holder 23. The disk-shaped holding plate 62 is supported in the cavity 13 between the upper electrode 1 and the target member 2 to be capable of rotating about the central axis of the upper electrode 1 by means of a bearing 8. Therefore, the center of the holding plate 62, which serves as the center of rotation of the magnet mechanism 6, coincides with the central axis of the circular, upper electrode 1. Each magnet 61 is provided such that the lower surface of the magnet mechanism 6 and the upper surface of the target member 2 preferably have a small interval of about 1 mm between them.

To rotate the holding plate 62 including the large number of magnets 61, the upper surface of the holding plate 62 is connected to a motor 9 via gear devices 10a and 10b. The gear devices 10a and 10b on the upper surface of the holding plate 62 are connected to each other by a rod 11 made of an insulator. This prevents any high-frequency current from flowing through the motor 9 and magnet mechanism 6.

The rod 11 made of an insulator extends through a small hole 12 formed in the upper electrode 1. The diameter of the small hole 12 formed in the upper electrode 1 must be as small as possible to prevent any high-frequency current from flowing through the cavity 13 between the upper electrode 1 and the target member 2.

The magnet mechanism 6 including the holding plate 62 rotates at a predetermined rotational speed (at, for example, 1 to 100 rpm). The motor 9 is preferably disposed outside the side wall 21 of the reaction vessel 50 and actuated by a DC or AC current. Another technique can also be used to rotate the magnet mechanism 6, and a certain type of magnetic coupling which does not require the use of the small hole 12, for example, can be used.

Figure 7:
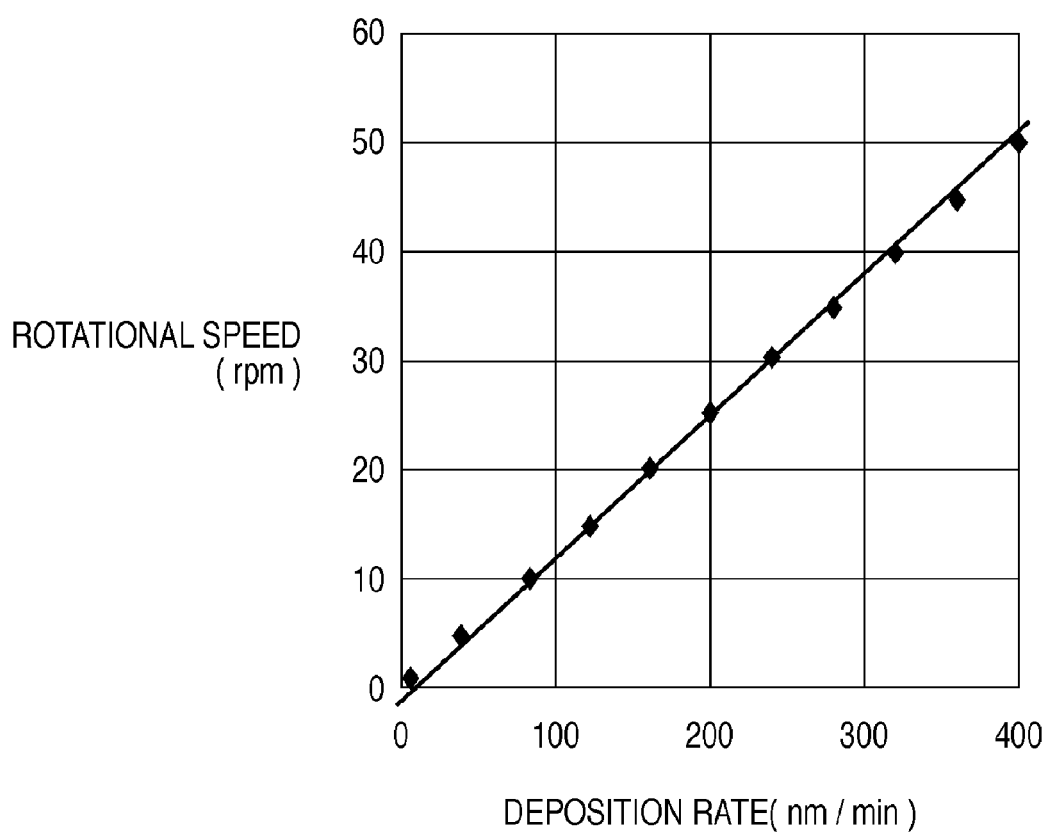
FIG. 7 is a graph showing the relationship between the rotational speed of the magnets and the deposition rate.

When the plasma processing apparatus is a sputtering apparatus, the rotational speed of the magnet mechanism 6 is preferably set such that the rotational speed ($min^{-1}$) and the deposition rate (nm/min) have a ratio (rotational speed/deposition rate) of 1/8 or more in accordance with the rotational speed, as shown in FIG. 7. FIG. 7 shows a linear function with a slope of 1/8. In the beginning of plasma generation, the plasma density distribution on the target surface is not sufficiently uniform, so erosion is not uniform, either. Especially when the deposition rate is high, the target is sputtered in large amounts in the beginning of plasma generation, so erosion nonuniformity is relatively large at that time. Hence, the erosion uniformity and the target use efficiency can further be improved by setting the value of (rotational speed)/(deposition rate) to 1/8 or more in accordance with the deposition rate. Note that when this value is less than 1/8, the target life shortens. A function of automatically calculating the rotational speed in accordance with the type of film, the deposition time, and the deposition thickness may be imparted to the apparatus.

Although a rotation mechanism which rotates the magnet mechanism 6 according to this embodiment includes, for example, the motor 9, rod 11, gear devices 10a and 10b, and bearing 8, the present invention is not limited to these constituent elements as long as this rotation mechanism implements the performance of the sputtering apparatus.

FIG. 2 is a plan view showing the magnet mechanism 6 when viewed from the side of the target member 2.

The plurality of magnets 61 are regularly arranged such that every set of two adjacent magnets 61 have an equal distance between them and have magnetic poles with opposite polarities. Also, each magnet 61 is disposed to form a grid point of a regular polygonal grid. Moreover, the plurality of magnets 61 are arrayed to be point-symmetrical about a specific point A1 (to be referred to as the central point of the magnets hereinafter).

In an example shown in FIG. 2, each magnet 61 is disposed to form a corresponding vertex of a square grid. The interval between the adjacent magnets 61 is set to fall within the range of, for example, 10 mm to 50 mm. The magnets 61 have the same size. The cross-sectional shape of the magnet 61 (the shape of its cross-section perpendicular to the direction in which the cylindrical magnet 61 extends) is a tetragonal or circular shape. If the cross-sectional shape of the magnet 61 is a circular shape, the diameter of its cross-section may change within the range of, for example, 5 mm to 40 mm. If the cross-sectional shape of the magnet 61 is a tetragonal shape, it has a size equivalent to that of the former magnet 61.

The height of the magnet 61 can be set to fall within the range of, for example, 5 mm to 30 mm. Also, the strength of the magnet 61 is selected so as to generate a magnetic field 24 (see FIG. 1) with a strength of, for example, about 100 G to 600 G.

The layout condition and strength of the magnets 61 are not limited to those mentioned above, and can be arbitrarily changed in accordance with the design of the plasma apparatus.

Also, as shown in FIG. 2, the plurality of magnets 61 are arranged on the holding plate 62 such that the central point A1 of the plurality of magnets 61 becomes different from the center of rotation A2 of the holding plate 62, which serves as that of the magnet mechanism 6. In other words, the central point A1 of the plurality of magnets 61 shifts from the center of rotation of the magnet mechanism 6.

More specifically, upon shifting the barycenter of a regular polygon (a regular tetragon in case of FIG. 2) formed by the plurality of magnets 61 from the center A2 of the holding plate 62 in the magnet mechanism 6, all the magnets 61 have different rotational trajectories when they are rotated by the rotation mechanism of the magnet mechanism 6.

Therefore, not a vertical magnetic field alone but horizontal and vertical magnetic fields both alternately run through the circumference of a single circle C on the target surface. This makes it possible to prevent the magnetic field formed by the magnets 61 from being predominantly (in a concentrated manner) oriented in the vertical direction on the circumference of a single circle on the target surface, thus suppressing a relative slowdown in sputtering rate on the circumference of the single circle on the target surface. As a result, it is possible to prevent the sputtered substances from depositing on the target member 2 again, thus suppressing particle generation due to this process. This also leads to an improvement in target use efficiency as the erosion region on the target member 2 to be sputtered becomes nearly uniform on the surface of the target member 2.

Moreover, a uniform plasma can be radially generated in the vicinity of the surface of the target member 2 as a point-cusped magnetic field is formed on the target member 2 by the large number of point-like magnets 61 arrayed in a grid pattern. In case of the point-cusped magnetic field, the strength of a magnetic field formed by each point-like magnet can be made relatively small. As a result, it is possible to prevent any magnetic field from being formed to extend to the wafer 17, thus preventing any local increase in charge and any electrical breakdown of elements based on this local increase in charge when a high-frequency bias voltage is applied to a substrate such as the wafer 17.

Figure 9A:
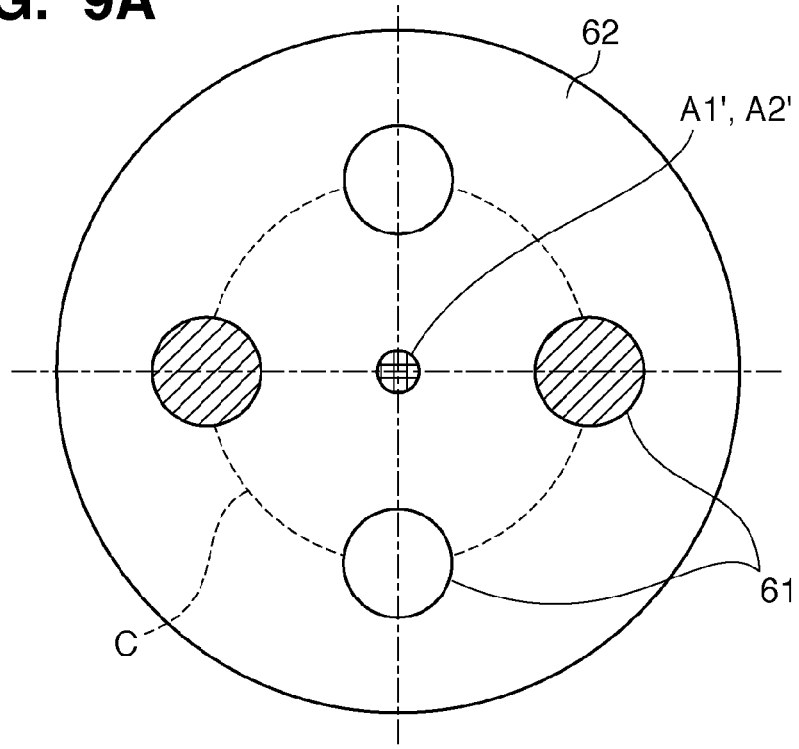
FIGS. 9A and 9B are views showing an exemplary case (prior art) in which the center of rotation of a magnet mechanism (the center of rotation of a holding plate) and the central point of a large number of magnets coincide with each other.
Figure 9B:
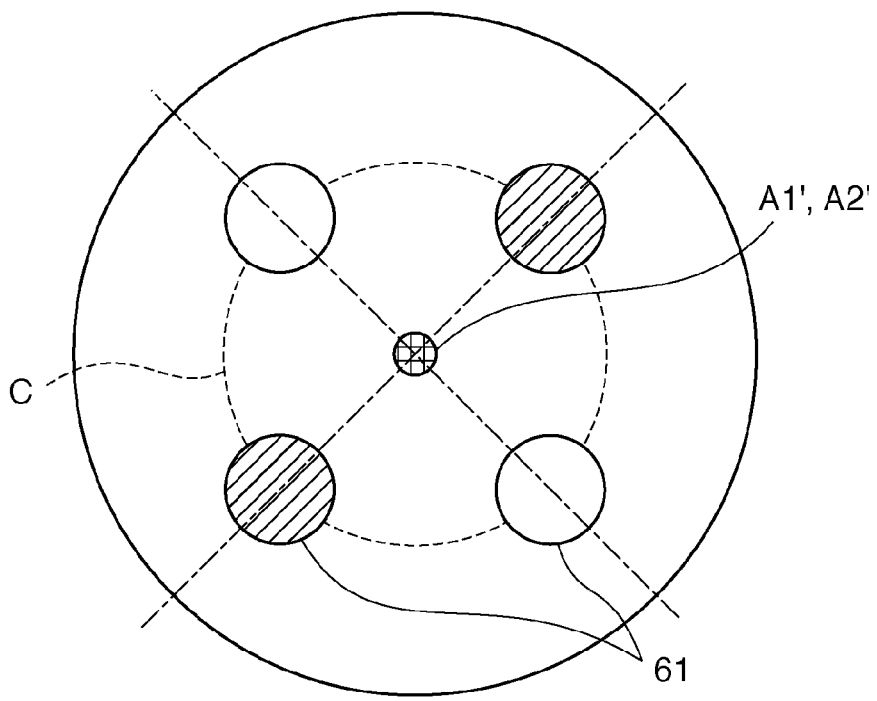

FIGS. 9A and 9B are explanatory views when the center A2' of the holding plate 62, which serves as the center of rotation of the magnet mechanism 6, coincides with the central point A1' of the plurality of magnets 61. The magnets 61 indicated by hatched circles in FIGS. 9A and 9B have north poles at their end portions facing the wafer holder 23, and those indicated by open circles in FIGS. 9A and 9B have south poles at their end portions facing the wafer holder 23.

As shown in FIG. 9B, the plurality of magnets 61 are positioned on the circumference of a single circle C having the center of the holding plate 62 as its center even when the holding plate 62 rotates clockwise through 45° about the center A2' as the rotation axis. Therefore, the vertical magnetic field on the surface of the target member concentrates on the circumference of the circle C, and the plasma density becomes lower on the circumference of circle C than in other regions. This means that portions on the surface of the target member 2, which correspond to the regions inside and outside the circumference of the circle C are strongly sputtered, but the sputtering rate becomes relatively low and re-deposition of the sputtered atoms predominates on the circumference of the circle C.

Figure 3A:
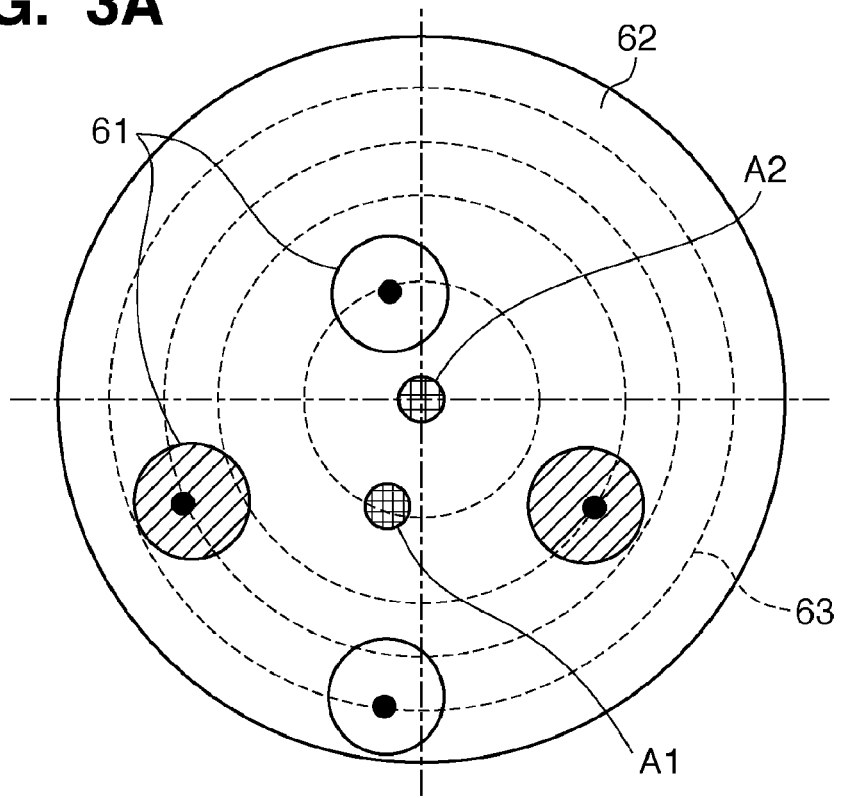
FIGS. 3A and 3B are views showing an exemplary case (present invention) in which the center of rotation of the magnet mechanism (the center of rotation of a holding plate) and the central point of a large number of magnets shift from each other.
Figure 3B:
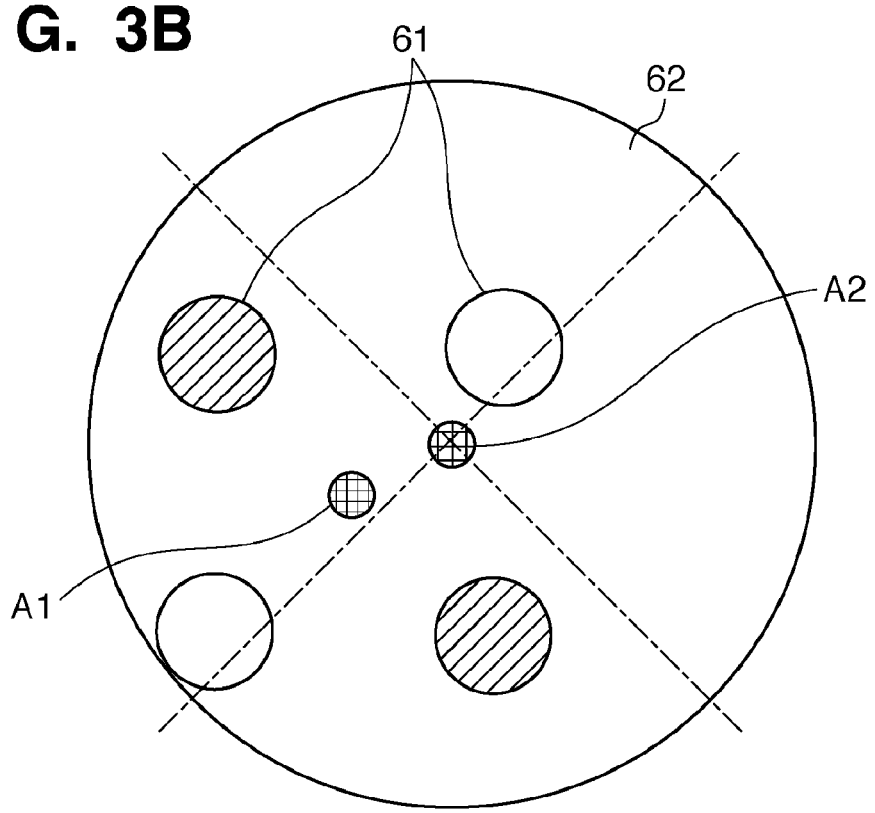

FIGS. 3A and 3B are explanatory views when the center A2 of the fixing member 62, which serves as the center of rotation of the magnet mechanism 6, and the central point A1 of the plurality of magnets 61 shift from each other. The magnets 61 indicated by hatched circles in FIGS. 3A and 3B have north poles at their end portions facing the wafer holder 23, and those indicated by open circles in FIGS. 3A and 3B have south poles at their end portions facing the wafer holder 23.

To prevent the sputtered substances from depositing on the target member 2 again, the magnets 61 of the magnet mechanism 6 are arranged to be asymmetrical about the center (rotation axis) A2 of the holding plate 62 and rotated about the center of the holding plate 62 as the rotation axis, as shown in FIG. 3A.

At this time, as shown in FIG. 3B, the plurality of magnets 61 have different trajectories 63 when they are rotated by the rotation mechanism of the magnet mechanism 6 upon rotating the holding plate 62 clockwise through 45° about the center A2 as the center of rotation. Therefore, even when the sputtered substance deposits again at a position corresponding to the magnet 61 of the target member 2, the re-deposited film is immediately sputtered and returned into the plasma due to factors associated with the rotation of the magnet mechanism 6. This means that any particle source upon plasma processing is eliminated.

Although the magnets 61 have the same diameter and height in this embodiment, magnets 61 with different heights may be used to have different strengths, as in a side view shown in FIG. 4.

Also, in this embodiment, the center of rotation of the magnet mechanism 6 is made different from the central point of the magnet 61 while the center of the holding plate 62, which serves as the center of rotation of the magnet mechanism 6, coincides with the central axis of the circular, upper electrode 1. Instead of this, the rotation axis of the magnet mechanism 6 may be made different from the central point of the magnet 61, and the center of the target member 2 may be made different from the center of rotation of the magnet mechanism 6.

Moreover, in the above-described embodiment, the large number of magnets 61 are arrayed such that the magnets 61 have different distances from the center A2 of the disk-shaped holding plate 62 (the center of rotation of the magnet mechanism 6), that is, all the magnets 61 have different rotational trajectories. However, the present invention is not limited to such a magnet array. Each pair of four magnets 61 which form corresponding grid points of a unit tetragonal grid may have the same rotational trajectory as long as their positions are obtained by shifting the center of a square grid (the barycenter of a regular tetragon) from the rotation axis. Nevertheless, the effect of the present invention is great when all the magnets 61 have different rotational trajectories.

Figure 5:
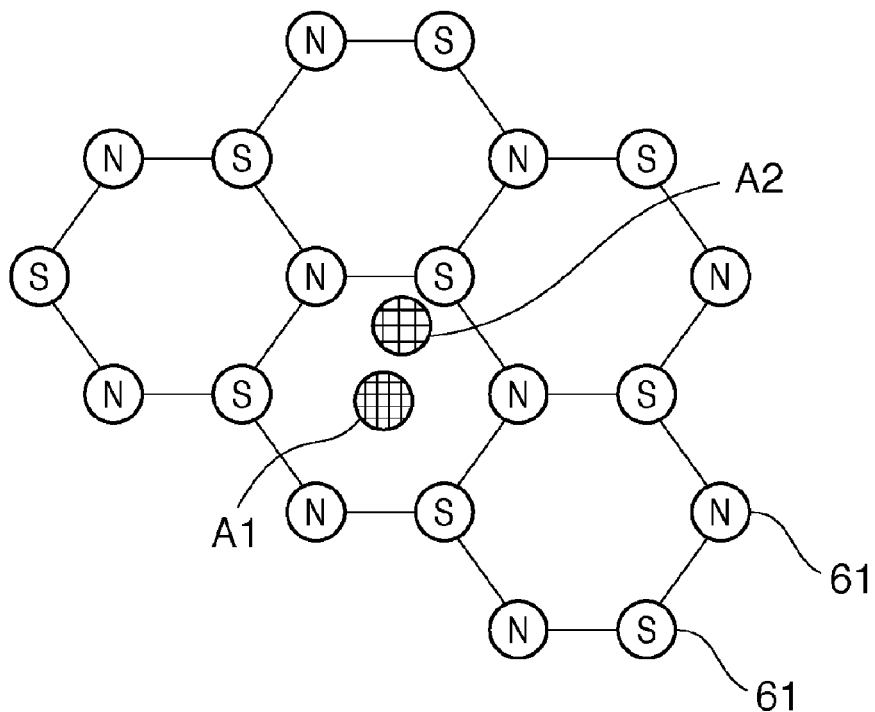
FIG. 5 is a view illustrating the magnet arrangement according to another embodiment.
Figure 6:
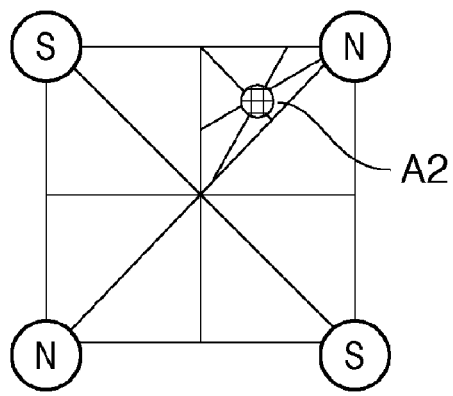
FIG. 6 is a view illustrating the magnet arrangement according to still another embodiment.

Although an example in which the magnets 61 are arranged in a square grid pattern has been given, the present invention is not limited to this. For example, the magnets 61 may be arrayed so as to form corresponding grid points of a regular hexagonal grid (see FIG. 5) obtained by connecting a plurality of regular hexagons in a honeycomb pattern. Also, as shown in FIG. 6, when magnets are arranged in a square grid pattern, the barycenter of one of right-angled isosceles triangles obtained by dividing the unit grid of a square grid into eight equal parts is preferably set as the center of rotation A2. Upon setting this barycenter as the center of rotation in this manner, uniform erosion can be formed regardless of the size, distance, and height of each magnet.

Although a sputtering apparatus has been described in this specification, the present invention may be applied to other plasma processing apparatuses such as a CVD apparatus.

[Example of Device Manufacturing Method]

Figure 8A:
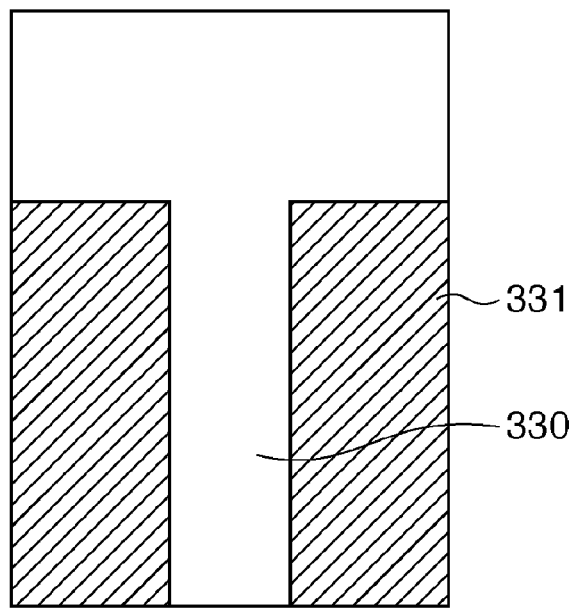
FIGS. 8A to 8D are views showing an example of application of the plasma processing apparatus to the device manufacture.
Figure 8B:
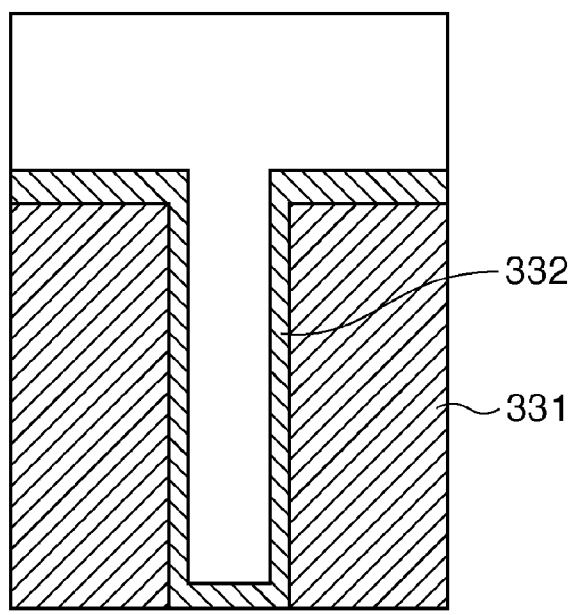
Figure 8C:
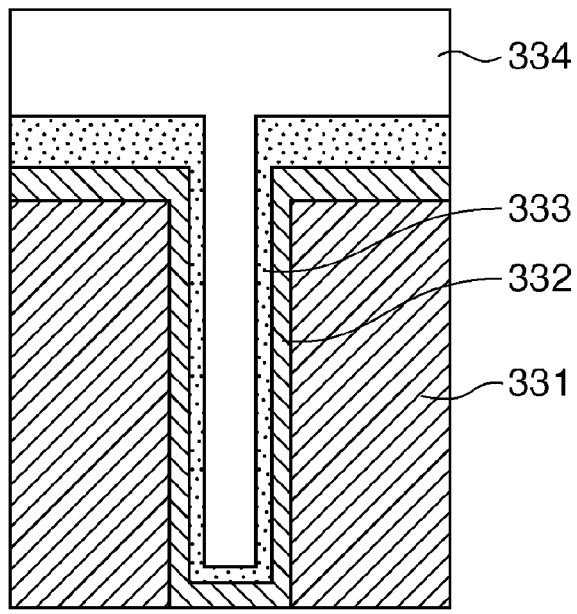

FIGS. 8A to 8D show an example in which a sputtering apparatus which exemplifies the plasma processing apparatus according to the above-described embodiment is applied to the device manufacture. FIGS. 8A to 8D show an example in which an aluminum interconnection is deposited in a trench. FIG. 8A shows the state in which a trench 330 is formed using silicon dioxide 331. A barrier layer (for example, TiN) 332 is deposited on the silicon dioxide 331 by a sputtering method using the sputtering apparatus shown in FIG. 1 (FIG. 8B), and an interlayer (for example, Ti) 333 is further deposited on the barrier layer 332 using a different target (FIG. 8C). The interlayer 333 is used to improve the wettability of the barrier layer 332 to make it easy to bury an interconnection layer 334 in the trench 330.

In such a process, when deposition is performed at a relatively high voltage (4 Pa or more) using the apparatus shown in FIG. 1, the barrier layer 332 and interlayer 333 can be formed with high coverage performance even for a trench with a high aspect ratio. Also, according to the present invention, the target use efficiency is high and particle generation can be suppressed.

Figure 8D:
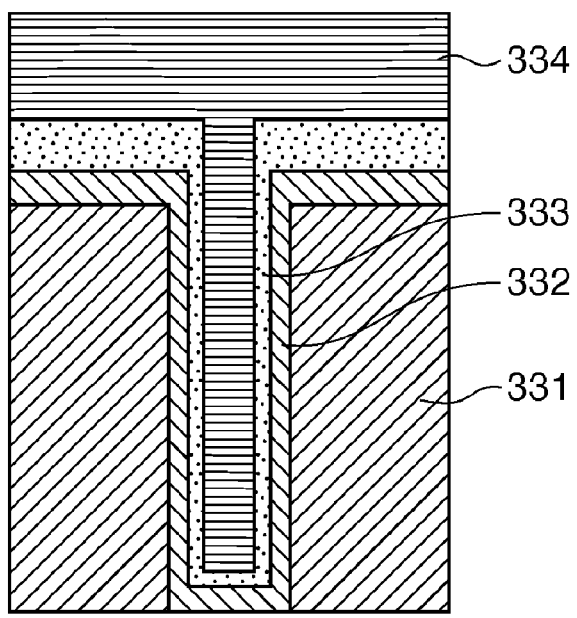

An interconnection layer can be buried in the trench 330, as shown in FIG. 8D, by depositing aluminum or an aluminum alloy on a substrate by sputtering at, for example, 300° C. or more.

Although an aluminum interconnection has been described above, the present invention is not limited to this, and is very preferably applicable especially to trench or hole burying.

Although preferred embodiments of the present invention have been described above with reference to the accompanying drawings, the present invention is not limited to these embodiments, and can be changed into various forms within the technical scope understood from a description of the scope of claims.

The invention claimed is:

1. A magnetic field generating apparatus which generates a cusped magnetic field on an electrode, the apparatus comprising:
   a magnet mechanism which is attached to the electrode and includes a plurality of magnets held on a holding plate; and
   a rotation mechanism which rotates the holding plate,
   wherein the plurality of magnets are arranged at grid points of a regular polygonal grid, and arrayed to be point-symmetrical about a center of a unit grid of the regular polygonal grid,
   a center of rotation of the holding plate by said rotation mechanism falls within the unit grid, and is at a position shifted from the center of the unit grid,
   the regular polygonal grid comprises a square grid, and the center of rotation is at a barycenter of one of eight right-angled isosceles triangles having, as a hypotenuse, a side that connects the center of a unit grid of the square grid and one grid point of the unit grid.

2. The magnetic field generating apparatus according to claim 1, wherein the plurality of magnets are regularly arrayed such that every set of two adjacent magnets have different polarities.

3. The magnetic field generating apparatus according to claim 1, wherein a center of the electrode and the center of rotation of the holding plate by said rotation mechanism are aligned on an identical axis.

4. A plasma processing apparatus comprising:
   an upper electrode;
   a magnetic field generating apparatus defined in claim 1, which is attached to said upper electrode;
   a lower electrode on which a substrate to be processed is mounted; and
   a holding member which is disposed between said upper electrode and said lower electrode, and holds a target member.

5. The plasma processing apparatus according to claim 4, further comprising rotation control means for rotating the magnets such that a ratio (rotational speed/deposition rate) between a rotational speed ($min^{-1}$) and a deposition rate (nm/min) becomes not less than 1/8.

6. A device manufacturing method comprising a deposition step of performing deposition processing by a sputtering method using a plasma processing apparatus defined in claim 5.

* * * * *